United States Patent
Numai

(10) Patent No.: US 6,445,454 B1
(45) Date of Patent: *Sep. 3, 2002

(54) GYRO HAVING MODULATED FREQUENCY DRIVEN LASER

(75) Inventor: Takahiro Numai, Ninomiya-machi (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/419,784

(22) Filed: Oct. 18, 1999

(30) Foreign Application Priority Data

Oct. 19, 1998 (JP) .......................... 10-296580
Jul. 30, 1999 (JP) .......................... 11-217220

(51) Int. Cl.⁷ .............................................. G01C 19/66
(52) U.S. Cl. ....................................... 356/459; 356/461
(58) Field of Search ................... 356/459, 461; 372/94

(56) References Cited

U.S. PATENT DOCUMENTS 4,327,962 A * 5/1982 Redman ...................... 356/459
4,431,308 A   2/1984 Mitsuhashi et al. ......... 356/459
4,913,548 A   4/1990 Vick ........................... 356/459

FOREIGN PATENT DOCUMENTS

| JP | 60-148185 | 8/1985 |
| JP | 62-39836 | 8/1987 |
| JP | 63-250514 | 10/1988 |
| JP | 4-174317 | 6/1992 |
| JP | 5-288556 | 11/1993 |
| JP | 638529 | 5/1994 |
| JP | 6-140364 | 5/1994 |
| JP | 7-131123 | 5/1995 |
| JP | 7-146150 | 6/1995 |
| JP | 8-18166 | 1/1996 |
| JP | 8-125251 | 5/1996 |

OTHER PUBLICATIONS

English translation of "Explanatory Notes of Reference Numbers Appearing in Figure 8" of Japanese Application Laid–Open No. 07/146150, published Jun. 1995, and Figure 8.

* cited by examiner

*Primary Examiner*—Samuel A. Turner
(74) *Attorney, Agent, or Firm*—Fitzpatrick, Cella, Harper & Scinto

(57) ABSTRACT

A gyro and an operating method is capable of reducing coupling losses which arise when laser beams enter a photodetector and noise which develops due to light entering into a laser from external reflection points. The gyro includes a ring resonator type laser in which laser beams circularly counter propagate, and detects a change in a current or an impedance based on a beat which is generated by the interference of the laser beams counter propagating each other within the laser.

10 Claims, 10 Drawing Sheets

GYRO HAVING MODULATED FREQUENCY DRIVEN LASER

BACKGROUND OF THE INVENTION

1. Field of the Invention

The present invention relates to a gyro and a method of operating the gyro. More particularly, it relates to a gyro which utilizes a ring resonator type laser.

2. Related Background Art

Heretofore, a mechanical gyro having a rotor or a vibrator, and an optical gyro have been known as gyros each of which is used for detecting the angular velocity of a moving object. In particular, the optical gyro is capable of instantaneous start and has a wide dynamic range, and it is therefore innovating in the field of gyro technology.

Such optical gyros include a laser gyro of ring resonator type, a fiber-optic gyro, a gyro of passive ring resonator type, etc. Among them, a ring resonator type laser gyro employing a gas laser was begun to be developed earliest, and it has already been put to practical use for aircraft etc. Recently, a ring resonator type laser gyro of small size and high precision has also been proposed, and one disclosed in the official gazette of Japanese Patent Application Laid-Open No. 5-288556 is mentioned as an example.

The ring resonator type laser gyro in the prior art is such that a clockwise laser beam and a counterclockwise laser beam are once emitted out of a laser, and that both the laser beams are received by a photodetector, thereby to detect an electrical beat as a signal. Coupling losses are therefore suffered when the laser beams enter the photodetector.

Moreover, noise is induced by light which enters into the laser from reflection points lying outside the laser. In some cases, therefore, an optical isolator must be mounted for the purpose of avoiding the noise.

SUMMARY OF THE INVENTION

Further, it is often desired to make the drive system of the ring resonator type laser gyro smaller in size and lighter in weight or to reduce the influence of the noise of the driving power source of the laser gyro on the gyro itself.

An object of the present invention is to provide a gyro and an operating method therefor which are free from or are relieved from such problems as the coupling losses and the optical feedback noise.

Other objects of the present invention are to make the drive system of a ring resonator type laser small in size and light in weight, and to reduce the influence of the noise of the drive system on the ring resonator type laser.

A gyro according to the present invention is characterized by comprising a ring resonator type laser in which laser beams circularly counter propagate each other and whose driving source is a constant-voltage source, a beat signal being detected as a change in a current that flows through the ring resonator type laser.

The current change can be detected as a change in a voltage across a resistor which is connected in series with the ring resonator type laser.

A method of operating a gyro according to the present invention is characterized by comprising the steps of subjecting a ring resonator type laser to constant-voltage drive, and detecting a change in a current which flows through the ring resonator type laser so as to use the change as a signal for finding a magnitude of an angular velocity which has been exerted on the ring resonator type laser.

Further, the present invention is characterized in that the voltage for driving the ring resonator type laser is modulated with a frequency which lies outside a frequency band of the signal.

The present invention is also characterized in that the gyro including the ring resonator type laser is vibrated at a frequency which lies outside a frequency band of the signal, and that the signal is detected synchronously with the vibrations.

A gyro according to the present invention is characterized by comprising a ring resonator type semiconductor laser in which laser beams circularly counter propagate each other, a beat signal being detected as a change in impedance of said semiconductor laser.

Besides, a method of operating a gyro according to the present invention is characterized by comprising the step of detecting a change in impedance of a ring resonator type semiconductor laser so as to use the change as a signal for finding a magnitude of an angular velocity which has been exerted on the ring resonator type semiconductor laser.

More concretely speaking, the change in current and the change in impedance means the change of frequency in current and the change of frequency in impedance, respectively.

DESCRIPTION OF THE PREFERRED EMBODIMENTS

Now, the present invention will be concretely described.

Figure 1:
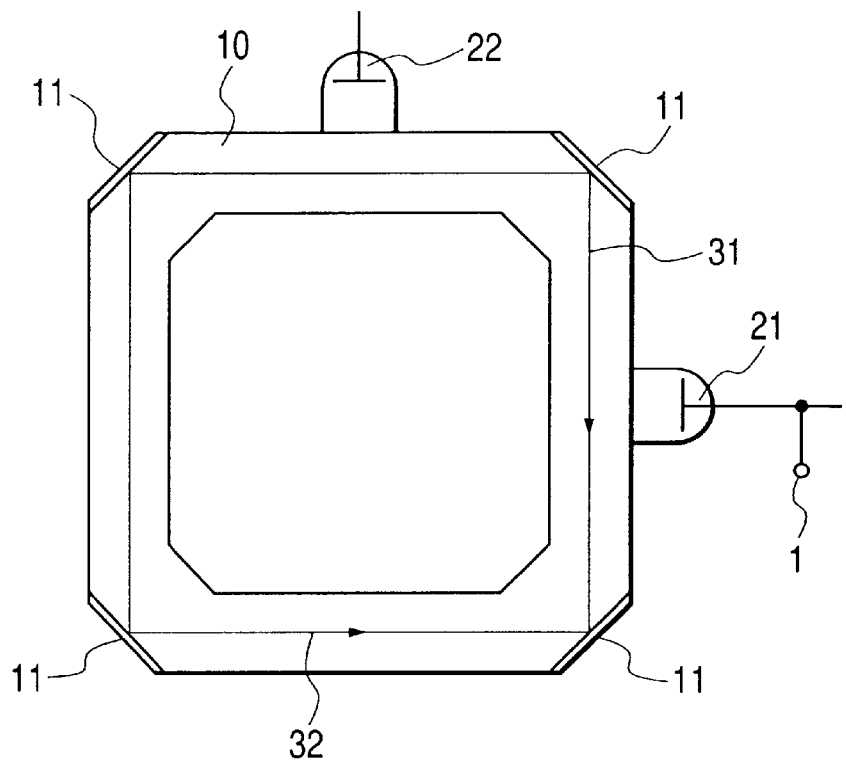
FIG. 1 is a schematic plan view showing an example of an optical gyro according to the present invention.

In a ring resonator type laser as illustrated in FIG. 1, laser beams propagate circularly. More specifically, the laser beams consist of a laser beam (31) which propagates clockwise within the laser, and a laser beam (32) which propagates counterclockwise. On condition that the laser is stationary, both the laser beams have an identical lasing frequency. In contrast, when the laser is rotated, a difference $\Delta f$ arises between the lasing frequencies of the clockwise laser beam (31) and the counterclockwise laser beam (32), and it is given by the following formula:

$$\Delta f = (4S/\lambda L)\Omega \qquad (1)$$

wherein letter S denotes a closed area surrounded by an optical path, symbol $\lambda$ the identical lasing wavelength of the laser beams, letter L an optical path length, and symbol $\Omega$ the angular velocity of the rotation.

When the laser beams interfere within the laser in employing a constant-current source as the driving power source of this laser, a population inversion variation results in a change in the voltage across the electrodes of the laser. Since a change in the population inversion appears as a change in the terminal voltage of the laser, the situation of the interference of the laser beams can be derived as a signal.

However, when a beat signal based on the interference of the laser beams is derived as the change of the terminal voltage, the derivation is sometimes influenced by the noise of the driving power source. It is therefore desired to lessen the influence of the noise.

Further, it is often desired to make the driving system of the laser, including the power source, smaller in size and lighter in weight.

As stated above, the population inversion changes when the laser beams interfere within the ring resonator type laser. In this regard, in electrically pumped lasers, such as gas lasers or semiconductor lasers, through which a current is caused to flow, the change of the population inversion and the impedance of the laser have the relation of one-to-one correspondence.

Accordingly, the situation of the interference of the laser beams in the laser, in other words, the beat signal, can be detected as the change of the impedance across the electrodes of the laser.

Besides, in employing the constant-voltage source as the driving power source, the beat signal can be obtained as the change of the current flowing through the laser.

In the present invention, the laser is equipped with the terminals for detecting the change of the current or impedance based on the beat created by the interference of the laser beams counter-propagating each other within the laser. Thus, the beat signal corresponding to the rotation of the laser can be derived from the terminals. It is accordingly possible to provide an optical gyro which can omit a photodetector and an optical system for optical coupling as have been indispensable to the prior-art gyro.

Regarding this characterizing feature, when the ring resonator type laser is so constructed that the gyro includes total internal reflection surfaces for the generated laser beams, no mirror loss is involved, and hence, the lasing threshold value of the laser can be lessened.

In addition, the gyro according to the present invention is characterized in that the total internal reflection surfaces are not disposed within the leaking distance range of evanescent light emitted from the ring resonator type laser. Even with the above construction, if the reflectors exist within the leaking distance range of the evanescent light, the reflectors and the laser will couple optically, and a loss will be suffered as viewed from the laser. Moreover, light from each reflector will be incident upon the laser, that is, the reflector will form a noise source. To the contrary, when the reflectors do not exist within the leaking distances of the evanescent light of the laser as in the present invention, the laser becomes optically independent of any other reflector, and it suffers neither the loss ascribable to the influence of the exterior of the laser, nor noise ascribable to the feedback light. Therefore, the gyro is remarkably improved in the points of the coupling loss and the optical feedback noise.

Besides, the semiconductor laser is less immune against surge noise, etc. Therefore, if the surge noise or the like enters the semiconductor laser from the terminals for detecting a change in the current flowing though the laser which is attendant on the rotation, this semiconductor laser will deteriorate or will lead even to destruction. In this regard, the deterioration and destruction of the semiconductor laser attributed to the surge noise or the like are preventable in such a way that a protective circuit for the laser is interposed between the detecting terminals and a circuit which measures a change in the current flowing through the laser. Of course, also the gas laser should desirably be equipped with a protective circuit as may be needed.

A method of operating a gyro according to the present invention is characterized in that, in the gyro constructed as described above, a change in the current or impedance detected from the terminals is used as a signal for finding the magnitude of the angular velocity which has been exerted on the ring resonator type laser. With this construction, it becomes possible to omit the photodetector and the optical system for optical coupling as have been indispensable to the prior-art gyro. It is therefore possible to provide gyro operating method which can eliminate the problems of the coupling loss and the optical feedback noise ascribable to these constituent components.

In the above operating method, it is also preferable that the voltage or current for driving the ring resonator type laser is modulated with a frequency which lies outside the frequency band of the signal.

The reason therefor is as stated below. In general, when a gyro is rotated, the lasing frequencies of a clockwise laser beam and a counterclockwise laser beam become different, and the difference $\Delta f$ is given by Formula (1) mentioned before. In a case where the difference $\Delta f$ in the lasing frequencies is small, there occurs the phenomenon of so-called "lock-in" in which the lasing frequencies are pulled in because of the nonlinearity of the medium of the laser, until $\Delta f = 0$ holds.

In contrast, when the laser is held in a state where the difference Δf of the lasing frequencies is kept fluctuating continually, as in the gyro of the above construction, the lock-in phenomenon is avoidable.

Dithering has heretofore been employed as an expedient for avoiding the lock-in phenomenon, but it corresponds to modulating the angular velocity Ω in Formula (1).

In, for example, the semiconductor laser, there has been known the phenomenon that the lasing frequencies fluctuate depending upon the magnitude of the current. The reason therefor is that the refractive index of the semiconductor of the laser is changed by the current. Accordingly, the wavelength in Formula (1) can be modulated by modulating the injection current of the semiconductor laser. It is consequently possible to establish the state in which the difference Δf is kept fluctuating continually.

Moreover, when the modulation is done at the frequency which lies outside the frequency band of the signal, the lock-in can be avoided without exerting any bad influence on the signal.

Of course, even when the voltage is modulated through a series resistor, the current flowing through the semiconductor laser is modulated, and hence, the same effect is attained. Also in the gas laser, the Q-factor of an active medium is fluctuated by modulating a current or a voltage, so that a lasing wavelength is modulated. The modulation is based on the fact that the lasing wavelength of the gas laser is determined by the Q-factor of the resonator and the Q-value of the resonant transition of atoms, molecules or ions. This phenomenon is known as the frequency pulling.

Besides, in the above operating method, the gyro including the ring resonator type laser is vibrated at a frequency which lies outside the frequency band of the signal, and the signal is detected from the terminals synchronously with the vibrations. Thus, the direction of the vibrations can be brought into correspondence with the magnitude of the signal detected from the terminals.

By way of example, in vibrating the optical gyro in the clockwise rotational sense, the beat frequency of the current detected from the terminals becomes large when the gyro is undergoing clockwise rotation, whereas the beat frequency of the current becomes small when the gyro is undergoing counterclockwise rotation.

It is accordingly permitted to discriminate whether the gyro is rotated clockwise or counterclockwise.

Moreover, the current is modulated with the frequency which lies outside the frequency band of the signal, whereby the sense of the rotation can be sensed without exerting any bad influence on the signal.

In the ensuing description, the constructions and operations of gyros and operating methods therefor according to the present invention will be detailed with reference to the drawings. Unless especially specified, the same constituents are designated by the same symbols throughout the drawings.

Embodiment 1

FIG. 1 is a schematic plan view showing an example of a gyro according to the present invention including a ring resonator type laser in which laser beams propagate circularly. The example corresponds to a case where the propagating path of the laser beams is square.

Referring to FIG. 1, numeral 1 designates an electric terminal, numeral 10 a quartz tube fabricated by boring a hole in quartz, numeral 11 a mirror, numeral 21 an anode, numeral 22 a cathode, numeral 31 the clockwise laser beam, and numeral 32 the counterclockwise laser beam.

In the above construction, helium gas and neon gas are introduced into the quartz tube 10, and a voltage is applied across the anode 21 and the cathode 22. Then, electric discharge starts into a state where a current flows.

When the quartz tube 10 is stationary, the lasing frequencies of the clockwise laser beam 31 and counterclockwise laser beam 32 are quite equal to each other and are 4.73× $10^{14}$ Hz, and the identical lasing wavelength thereof is 632.8 nm. For example, when the quartz tube 10 functioning as a resonator undergoes a rotation of 180 degrees per second and where the length of one side of the quartz tube 10 (in the shape of a regular square) is 10 cm, the frequency of beat becomes 496.5 kHz. On this occasion, a supply voltage is adjusted beforehand so as to be constant, and the current flowing through the laser is monitored at the electric terminal 1. Then, a signal having an amplitude of 10 mA and the frequency of 496.5 kHz is obtained. Especially, in employing a battery as a constant-voltage source, the driving system of the laser can be made much smaller in size and much lighter in weight.

Figure 2:
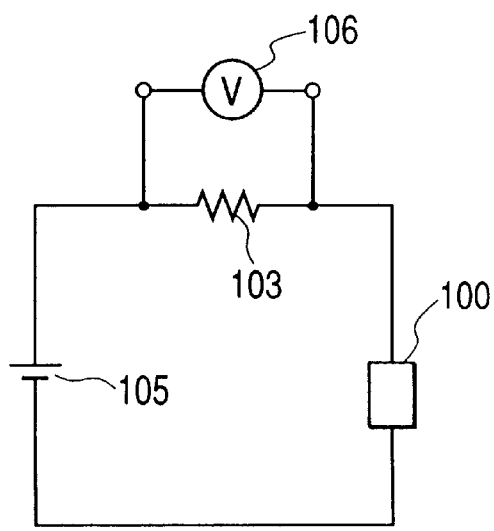
FIG. 2 is a circuit diagram showing an example of a circuit for detecting the change of beat according to the present invention.

FIG. 2 exemplifies a circuit which detects a change in a current flowing through a ring resonator type laser 100. Numeral 105 designates a battery, numeral 103 an electric resistor, and numeral 106 a voltmeter.

Owing to such a circuit arrangement, the rotation of the laser 100 is measured in terms of a change in the current flowing through the laser 100, more particularly the change of the frequency thereof.

By the way, in the circuit arrangement shown in FIG. 2, the voltmeter 106 may well be replaced with any other means capable of detecting the terminal voltage of the electric resistor 103.

Figure 3:
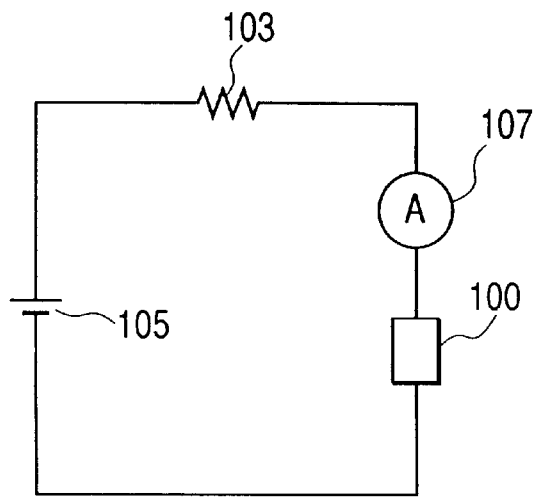
FIG. 3 is a circuit diagram showing another example of a circuit for detecting the change of beat according to the present invention.

Of course, as illustrated in FIG. 3, a change in a current flowing through a ring resonator type laser 100 may well be directly detected by an ammeter 107.

Figure 4:
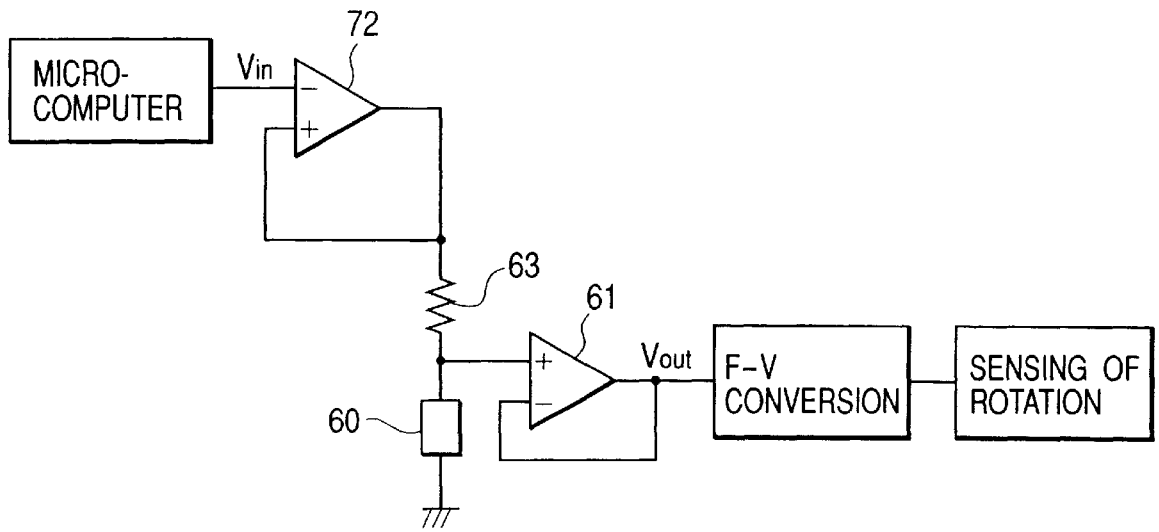
FIG. 4 is a circuit diagram showing still another example of a circuit for detecting the change of beat according to the present invention.

FIG. 4 exemplifies a circuit arrangement which detects a beat signal attendant upon the rotation of a ring resonator type laser 60 when the laser 60 is driven by constant-voltage. That is, the circuit arrangement senses the rotation in such a way that a current flowing through the laser 60 is read in terms of the voltage drop across an electric resistor 63.

The anode of the laser 60 is connected to the output terminal of an operational amplifier 72 through the resistor 63, while the cathode of the laser 60 is grounded.

The constant-voltage drive is such that, when a predetermined voltage ($V_{in}$) is applied to the inverting input terminal of the operational amplifier 72 by a microcomputer or the like, it is continually kept applied to the resistor 63 as well as the laser 60.

The electric resistor 63 is connected to a buffering operational amplifier 61. The operational amplifier 61 delivers an output signal $V_{out}$. Since the output signal $V_{out}$ has the beat frequency proportional to an angular velocity exerted on the laser 60, the beat frequency is converted into a voltage by a known frequency-to-voltage conversion circuit (F-V conversion circuit) or the like, thereby to sense the rotation. Of course, the rotation may well be detected in such a way that the electric resistor 63 is directly connected to the F-V conversion circuit.

Figure 19:
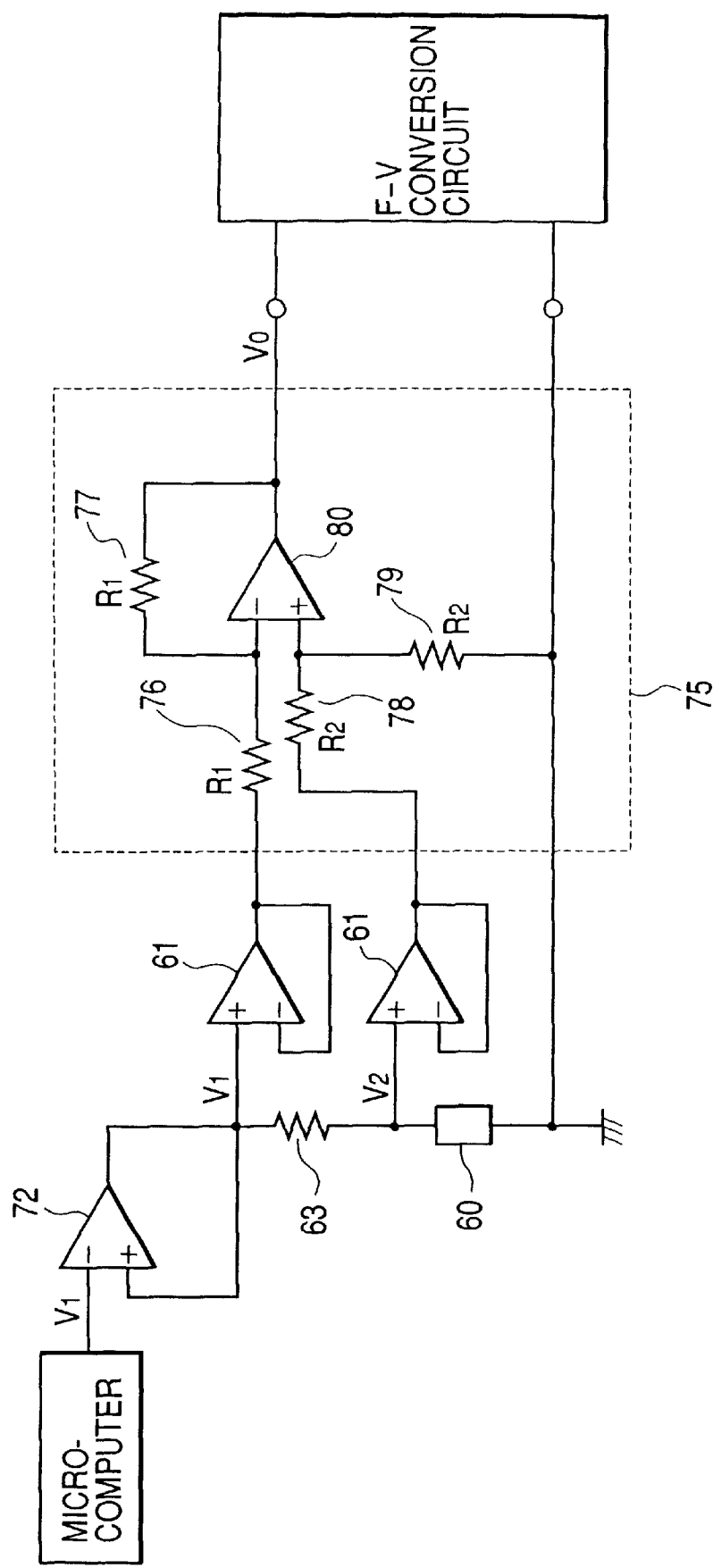
FIG. 19 is a circuit diagram showing an example of a circuit for detecting the change of beat according to the present invention.

Next, FIG. 19 illustrates a case where, in addition to the same constant-voltage drive construction as in FIG. 4, a subtraction circuit 75 is disposed so as to set the reference of a signal voltage at the ground.

Referring to FIG. 19, a predetermined voltage ($V_1$) is applied to the inverting input terminal of the operational amplifier 72 by a microcomputer or the like. Numeral 60 designates a ring resonator type laser, numeral 61 a voltage follower, and numeral 63 an electric resistor. In the subtraction circuit 75, numeral 80 indicates an operational amplifier. Numerals 76 to 79 indicate electric resistors. The resistors 76 and 77 have equal resistances $R_1$, while the resistors 78 and 79 have equal resistances $R_2$.

The voltages $V_1$ and $V_2$ of both the ends of the electric resistor 63 are respectively fed to the inverting input terminal and non-inverting input terminal of the operational amplifier 80 through the corresponding voltage followers 61 and the corresponding resistors 76, 78. Thus, a change in the voltage difference $V_2-V_1(=V_0)$ across the electric resistor 63 can be detected. In other words, a change in a current flowing through the ring resonator type laser 60 can be detected.

The rotation of the laser 60 is measured by passing the resulting signal through an F-V conversion circuit or the like.

Figure 5:
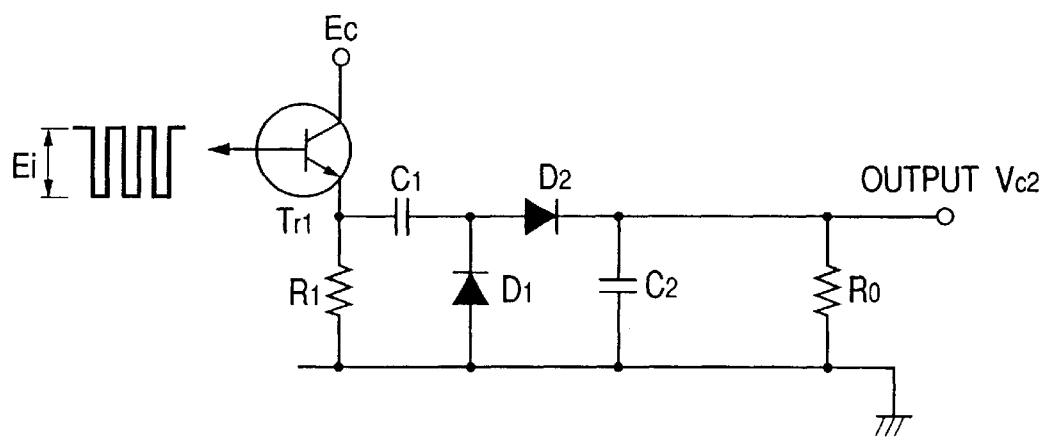
FIG. 5 is a circuit diagram showing yet another example of a circuit for detecting the change of beat according to the present invention.

Incidentally, FIG. 5 illustrates an example of the frequency-to-voltage conversion circuit (F-V conversion circuit), but it is needless to say that the conversion circuit is not restricted to the illustrated example. The exemplary circuit is configured of a transistor, diodes, capacitors and resistors. It delivers an output voltage $V_{c2}$ which is expressed by the following formula (2):

$$V_{c2} = \frac{E_i C_1 R_0 f}{1 + \frac{1}{1-\exp(-1/R_0 C_2 f)}} \quad (2)$$

wherein symbol $E_i$ denotes the peak-to-peak value of the input voltage of the F-V conversion circuit, and symbol f the beat frequency. The parameters of the circuit are set so as to establish $C_2 \gg C_1$ and $R_0 C_2 f < 1$. Thus, the following formula (3) holds:

$$V_{c2}=E_i C_1 R_0 f/2 \quad (3)$$

As understood from this formula, the voltage output proportional to the beat frequency can be obtained.

Figure 6:
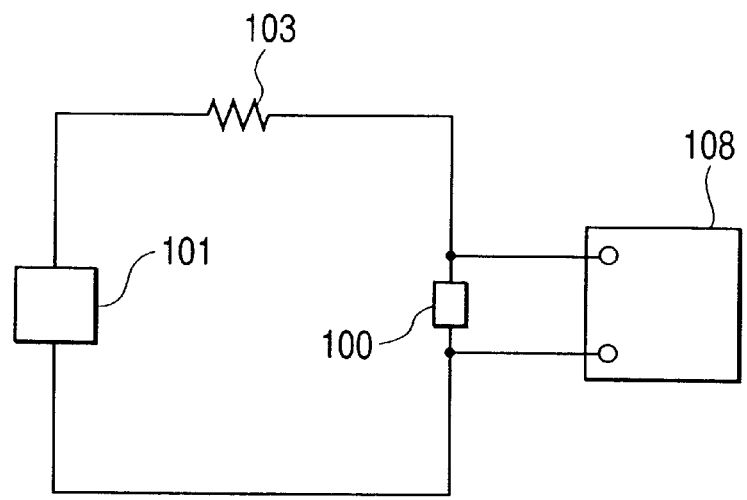
FIG. 6 is a circuit diagram showing a further example of a circuit for detecting the change of beat according to the present invention.

There have been mentioned above the examples in which the change of the terminal current is detected directly or indirectly. However, a change in the impedance of electric discharge may well be directly detected using an impedance meter. In the case of measuring the change of the impedance, the noise of a driving power source is less influential unlike in the case of measuring the terminal voltage or the current which flows through the laser, and hence, an optical gyro of higher sensitivity can be provided. A practicable circuit arrangement for detecting a change in the impedance is illustrated in FIG. 6. Referring to FIG. 6, numeral 101 designates a power source, and numeral 108 an impedance meter.

This embodiment has been described as to the case of employing the quartz tube 10 as shown in FIG. 1. However, it is also allowed to use a polymer material such as fluorinated polyimide or epoxy resin.

The gyro of the above construction has exemplified the laser employing helium gas and neon gas. However, the laser may be any other laser such as argon ion laser, carbonic acid gas laser or excimer laser.

Figure 7:
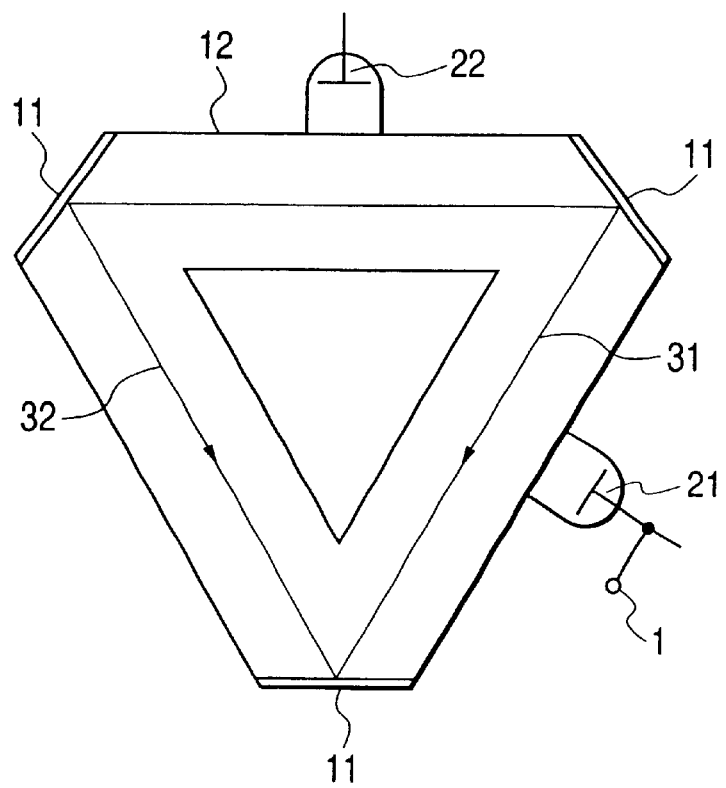
FIG. 7 is a schematic plan view showing another example of a gyro according to the present invention.

FIG. 7 is a schematic plan view showing another example of a gyro according to the present invention, including a ring resonator type laser in which laser beams propagate circularly. The example corresponds to a case where the propagating path of the laser beams is triangular.

With such a construction, the rotation of the laser 12 can be detected. As long as a clockwise laser beam and a counterclockwise laser beam pass through an identical path, the path along which the laser beams propagate circularly is not restricted to the square or triangular shape mentioned above.

Embodiment 2

Figure 8:
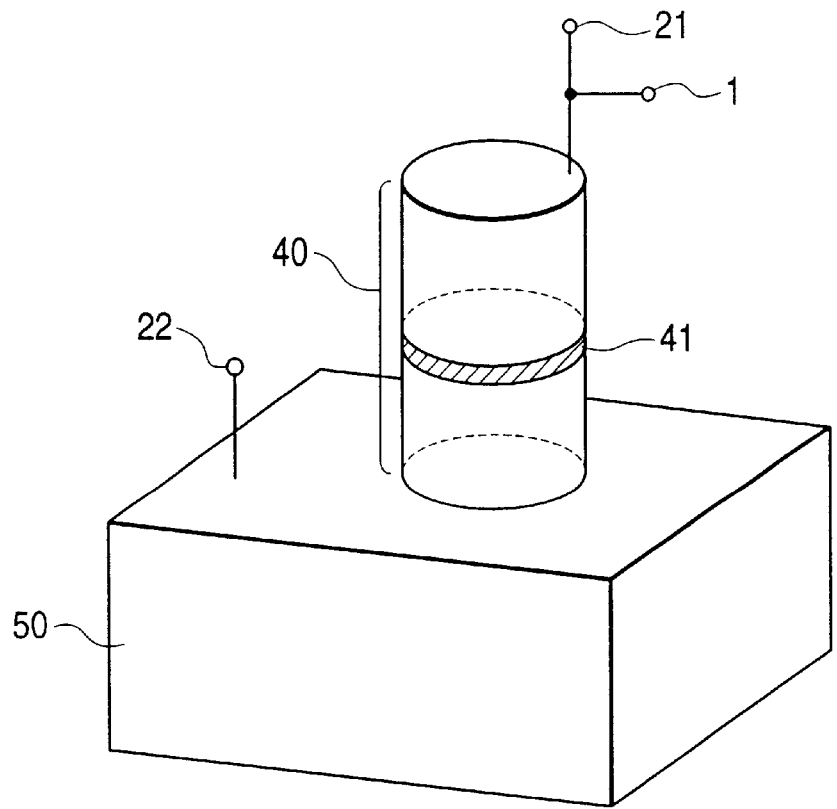
FIG. 8 is a schematic perspective view showing an example of a gyro including a semiconductor laser, according to the present invention.

FIG. 8 is a schematic perspective view showing an example of a gyro according to the present invention as includes a ring resonator type semiconductor laser in which laser beams propagate circularly. The example corresponds to a case where the semiconductor laser is in the shape of a circular cylinder.

Referring to FIG. 8, numeral 1 designates an electric terminal, numeral 21 an anode, numeral 22 a cathode, numeral 40 the semiconductor laser in the shape of the circular cylinder, numeral 41 an active layer comprised in the semiconductor laser 40, and numeral 50 a substrate for placing the semiconductor laser thereon. The semiconductor laser is fabricated by, for example, reactive ion beam etching which employs chlorine gas or bromine gas.

In the above construction, a current is injected from the anode 21 into the semiconductor laser. The active layer 41 consists of a layer of InGaAsP with a bandgap wavelength of 1.55 $\mu$m, optical guide layers of InGaAsP with a bandgap wavelength of 1.3 $\mu$m and which are respectively formed so as to sandwich the first-mentioned InGaAsP layer, and clad layers of InP which are respectively formed so as to overlie and underlie the optical guide layers. Since the semiconductor has a refractive index different from that air has, reflection arises at the interface of them.

Assuming the refractive index of the semiconductor to be 3.5, total internal reflection arises on condition that an angle defined between a normal to the interface and the laser beam is 16.6 degrees or above. When the laser beam undergoes the total internal reflection, a lasing threshold value may be smaller than in any other mode to the extent that a mirror loss is not suffered. In the total internal reflection mode, therefore, lasing starts at a lower level of injection current.

Moreover, since gains concentrate in the lasing mode, lasing in any other mode is suppressed. In a case where the radius of the semiconductor laser 40 as a resonator is 10 $\mu$m and where the thickness of the active layer is 0.1 $\mu$m, the lasing threshold current becomes 0.8 mA. When the gyro undergoes a rotation of 30 degrees per second as in the unintentional movement of a camera or the vibrations of an automobile, with the driving voltage of the laser set at 0.8 V, a signal having an amplitude of 0.1 mA and a frequency of 23.6 Hz is derived from the electrode terminal 1.

Figure 9:
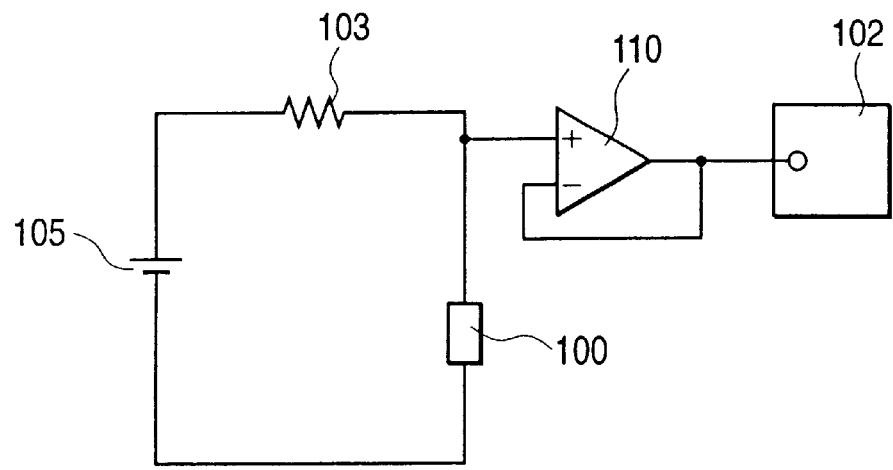
FIG. 9 is a circuit diagram for explaining an example of connecting a protective circuit for a semiconductor laser.

In addition, the deterioration or destruction of the semiconductor laser can be prevented by connecting the detecting terminal of this semiconductor laser with a protective circuit. FIG. 9 illustrates an example in which a voltage follower is connected as the protective circuit. Numeral 110 designates the voltage follower, and numeral 102 a current change detecting circuit. In actuality, the change of the voltage drop across an electric resistor 103 is observed because the other end of the electric resistor 103 is connected to the constant-voltage source.

Meanwhile, when a constant-voltage source is employed as the power source of the ring resonator type laser as in the present invention, the angular velocity of the gyro can be measured as a change in the current flowing through the laser. In employing the battery as the constant-voltage source as illustrated in FIG. 2 or FIG. 3 referred to before, the driving system of the gyro can be made small in size and light in weight. In the arrangement of FIG. 2, the electric resistor 103 is connected in series with the semiconductor laser 100, and the current flowing through the semiconductor laser 100 is measured as a change in the terminal voltage across the electric resistor 103. On the other hand, in the arrangement of FIG. 3, the ammeter 107 is connected in series with the semiconductor laser 100, thereby to directly measure the current flowing through the semiconductor laser 100. Of course, the rotation may well be sensed by the circuit arrangement illustrated in FIG. 4, as in Embodiment 1.

Also, without regard to the sort of the driving power source, a change in the impedance of the semiconductor laser can be directly measured by an impedance meter. In this case, the noise of the driving power source is less influential unlike in the case of measuring the terminal voltage or the current which flows through the laser. Such an example is illustrated in FIG. 6.

Besides, when the total internal reflection arises, evanescent light traveling along the interface exists. The leaking distance of the evanescent light is 0.074 $\mu$m for a lasing wavelength of 1.55 $\mu$m. The intensity of the evanescent light attenuates exponentially (the "leaking distance" signifies a distance at which the amplitude of an electric field attenuates to 1/e).

Accordingly, when the laser element is spaced about 10 $\mu$m from an object which exists outside this laser element and which can function as a reflector, the influence of feedback light is negligible. The above example of construction corresponds to a case where no reflector exists within 10 $\mu$m from the interface of the circular cylinder of the semiconductor laser 40, and it is not influenced by optical feedback noise.

Further, when the applied voltage of the laser is modulated under an amplitude of 0.1 V and a frequency of 2 kHz beforehand, it is possible to construct an optical gyro which is free from the phenomenon of lock-in even in a rotation corresponding to a beat low frequency short of 1 Hz. When the frequency of the modulation is set beforehand so as to lie outside the band of signal frequencies, the detection of the beat signal is not adversely influenced.

Incidentally, the materials of the InGaAsP system have been employed as semiconductor materials here. The semiconductor materials, however, may be of any other material system, such as GaAs system, ZnSe system, InGaN system, or AlGaN system.

Now, examples of the construction of the semiconductor laser 40 will be explained.

Figure 10:
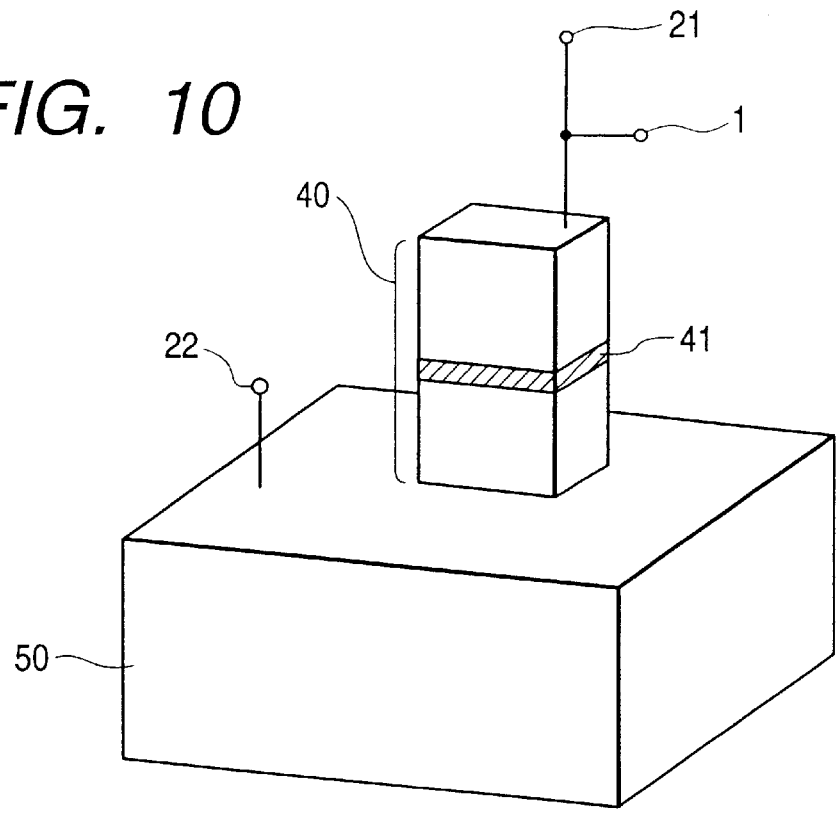
FIG. 10 is a schematic perspective view showing another example of an optical gyro including a semiconductor laser, according to the present invention.

FIG. 10 is a schematic perspective view showing another example of a gyro according to the present invention, including a ring resonator type laser in which laser beams propagate circularly. Herein, the semiconductor laser 40 is in the shape of a cuboid.

According to the exemplary construction, the number of propagation modes is smaller than that in FIG. 8, so that the number of lasing modes decreases to improve an S/N (signal-to-noise) ratio.

Figure 11:
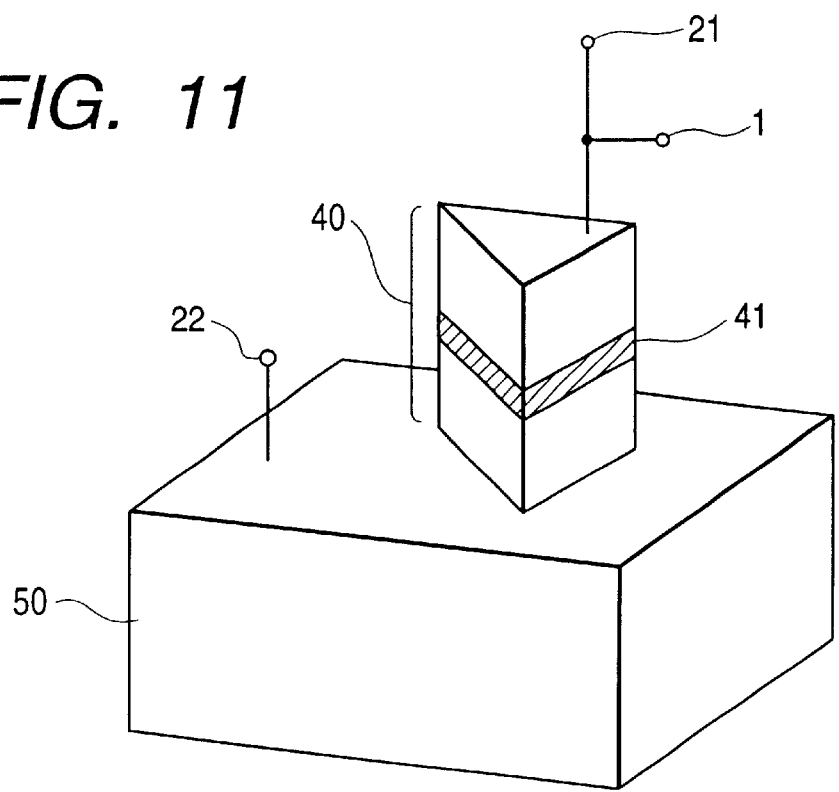
FIG. 11 is a schematic perspective view showing still another example of a gyro including a semiconductor laser, according to the present invention.

Of course, the semiconductor laser may well be in the shape of a wedge as illustrated in FIG. 11.

According to the exemplary construction, the number of lasing modes decreases still further, and the S/N ratio is improved more than in the case of FIG. 10.

Although the semiconductor laser 40 has been illustrated as being in the shape of the circular cylinder, cuboid or wedge, the shape thereof is not especially restricted as long as the ring resonator type laser is formed. By way of example, the shapes of a disc etc. may well be employed unlike the shape of the cylinder or the pole.

Figure 12:
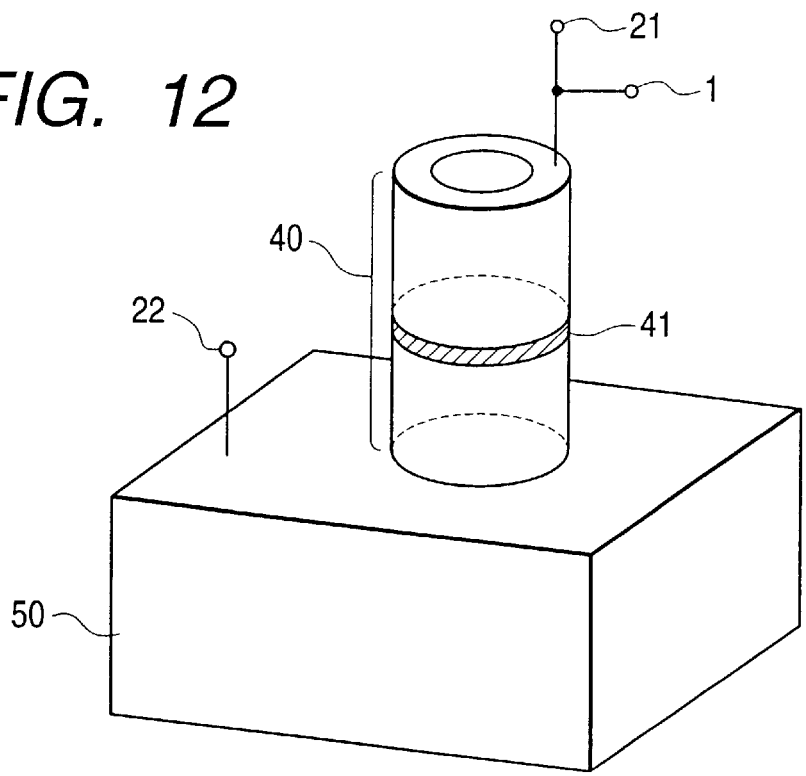
FIG. 12 is a schematic perspective view showing yet another example of a gyro including a semiconductor laser, according to the present invention.

FIG. 12 is a schematic perspective view showing another example of a gyro according to the present invention, including a ring resonator type laser in which laser beams propagate round. Herein, the semiconductor laser 40 is in the shape of a circular tube instead of the circular cylindrical shape.

Figure 14:
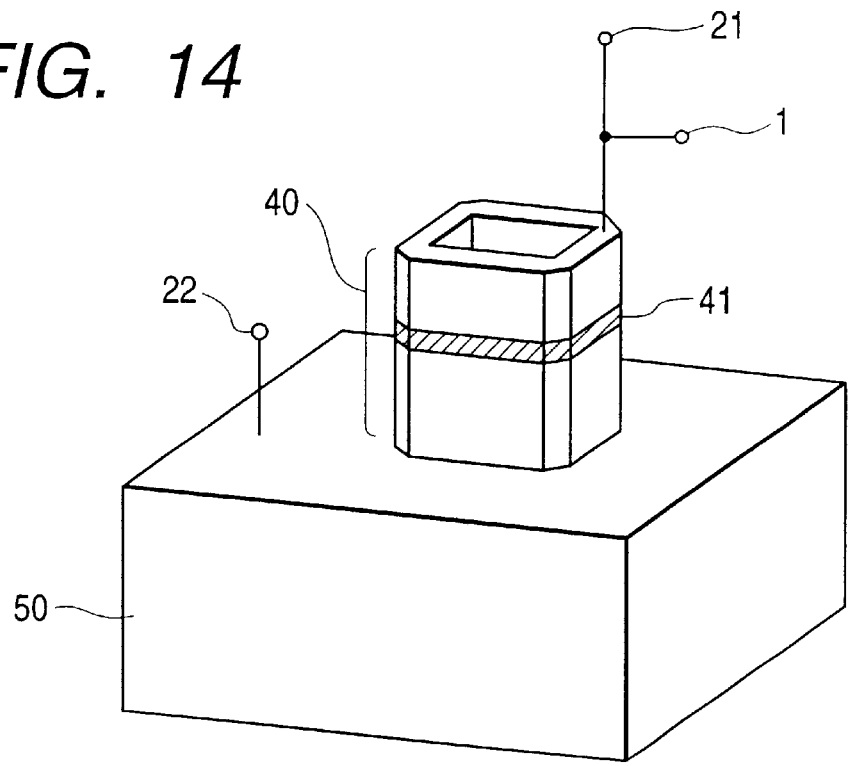
FIG. 14 is a schematic perspective view showing a still further example of a gyro including a semiconductor laser, according to the present invention.
Figure 16:
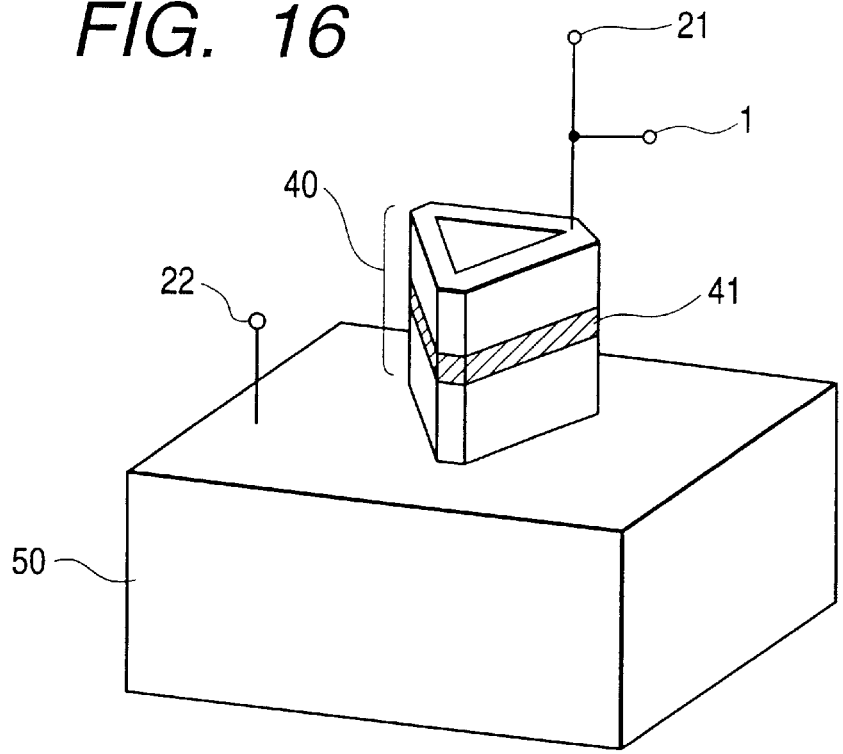
FIG. 16 is a schematic perspective view showing a different example of a gyro including a semiconductor laser, according to the present invention.

According to the exemplary construction, the laser beams circularly propagate along the interface of the semiconductor, so that the central part of the semiconductor laser 40 as a resonator can be omitted as seen from FIG. 12. Owing to the circular tubular shape shown in FIG. 12, gains can be bestowed on only the propagating laser beams, and the volume of the active layer 41 decreases, so that a required driving power is lowered still further. Of course, the semiconductor laser 40 may well be constructed into a square or triangular tubular structure as illustrated in FIG. 14 or FIG. 16.

Figure 13:
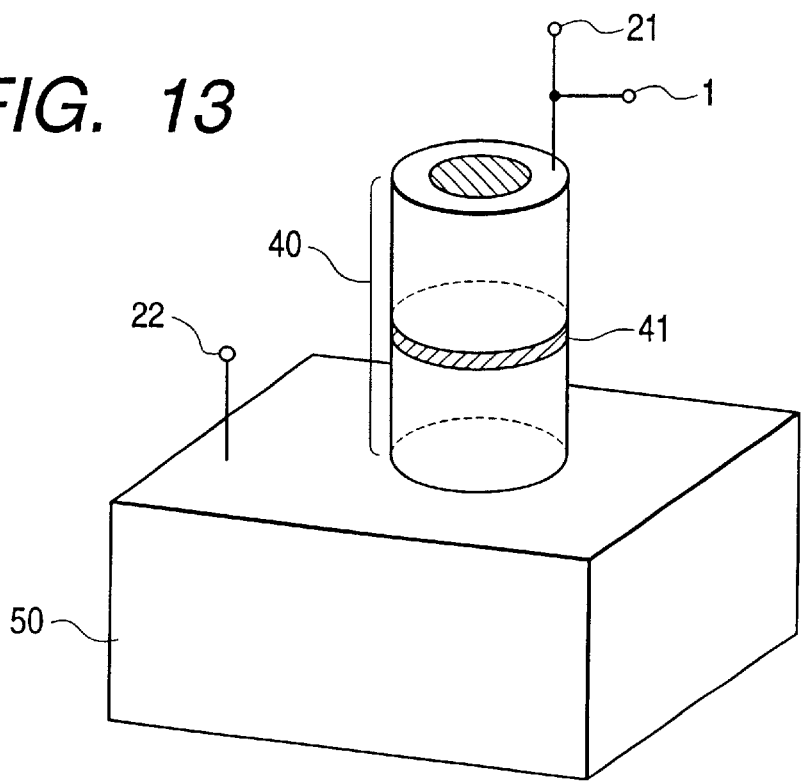
FIG. 13 is a schematic perspective view showing a further example of a gyro including a semiconductor laser, according to the present invention.

FIG. 13 is a schematic perspective view showing another example of a gyro according to the present invention, including a ring resonator type laser in which laser beams propagate circularly. The example corresponds to a case where the central part (crosshatched part) of the semiconductor laser 40 in the shape of a circular cylinder is rendered high in electric resistance by ion implantation. By way of example, the ion implantation can be carried out using protons as ions and under the conditions of a dose of $5 \times 10^{14}$ cm$^{-2}$ and an acceleration voltage of 100 keV. Incidentally, the laser beams are also distributed in a region implanted with the protons. Therefore, the semiconductor laser 40 should preferably be annealed at 200 to 400° C. for several minutes in order to reduce the light absorption loss of the region.

Figure 15:
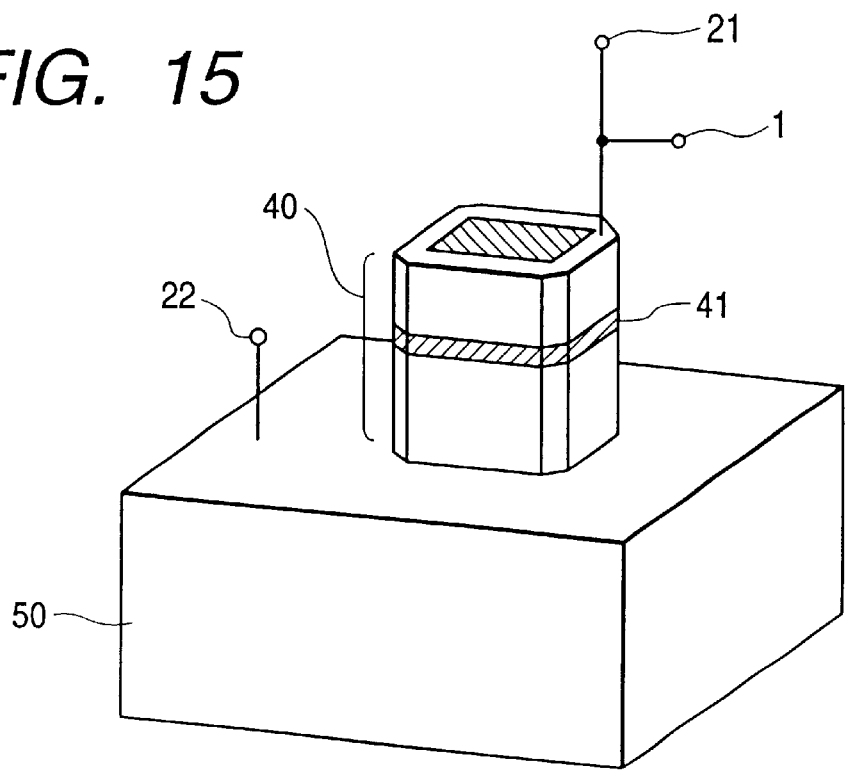
FIG. 15 is a schematic perspective view showing a yet further example of a gyro including a semiconductor laser, according to the present invention.
Figure 17:
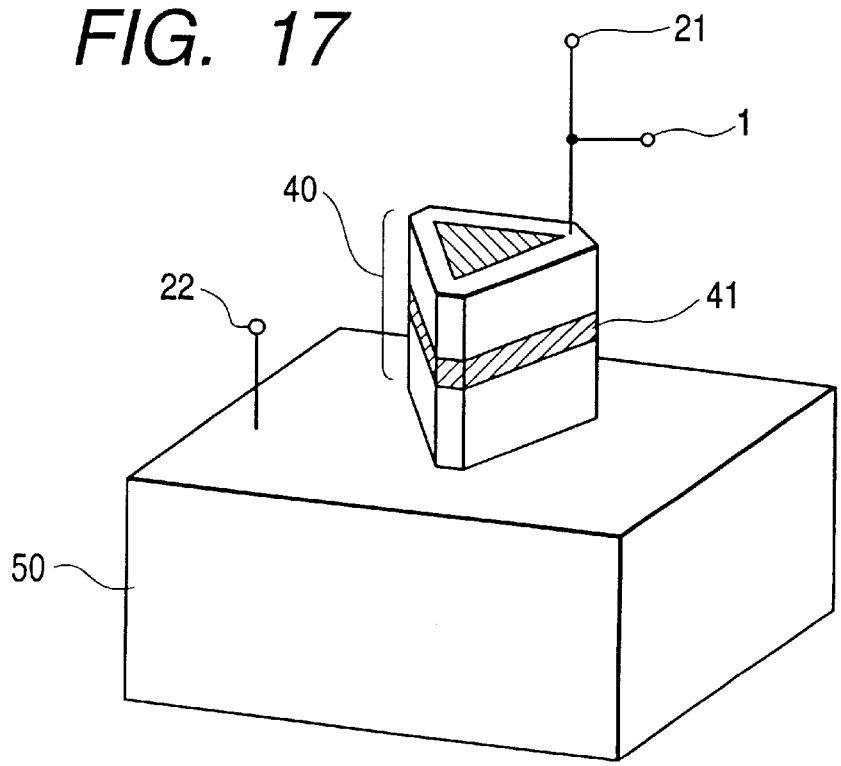
FIG. 17 is a schematic perspective view showing a still different example of a gyro including a semiconductor laser, according to the present invention.

Also with the exemplary construction, gains can be bestowed chiefly on the propagating laser beams, and the substantial volume of the active layer 41 decreases, so that a required driving power is lowered still further. The ion-implanted region is not restricted to the illustrated part, but a projection range may well come to the part of the active layer 41. The semiconductor laser 40 may well be constructed into the shape of a square or triangular pole as illustrated in FIG. 15 or FIG. 17.

Next, an example employing a piezoelectric element will be explained.

Figure 18:
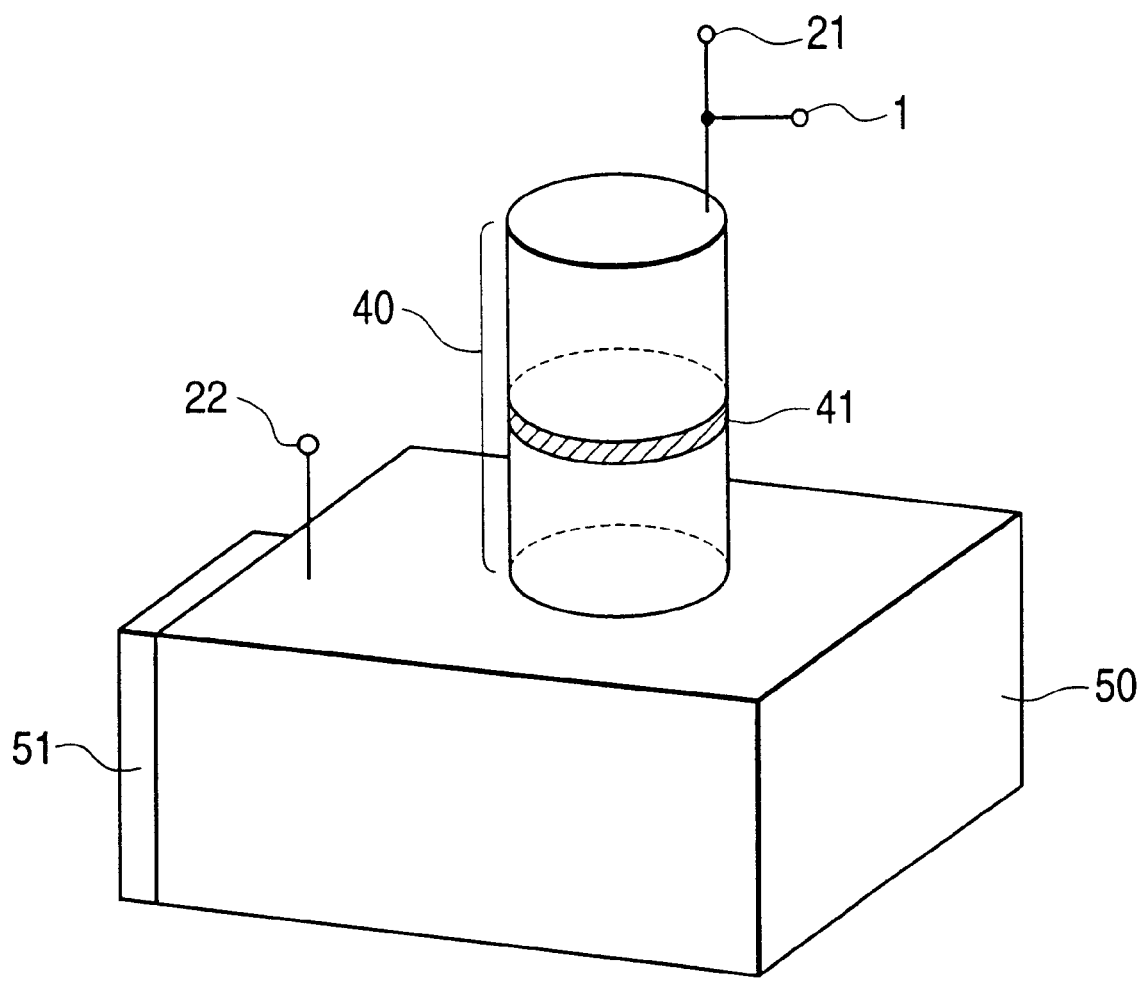
FIG. 18 is a schematic perspective view showing a yet different example of a gyro including a semiconductor laser, according to the present invention.

FIG. 18 is a schematic perspective view showing another example of a gyro according to the present invention, including a ring resonator type laser in which laser beams propagate round. In this example, the piezoelectric element 51 is attached to the substrate 50 on which the semiconductor laser 40 is formed.

According to the exemplary construction, the semiconductor laser 40 constituting the gyro can be vibrated with clockwise and counterclockwise rotations by applying a voltage at a frequency of, for example, 20 kHz to the piezoelectric element 51. The clockwise rotation and counterclockwise rotation can be discriminated in such a way that a signal synchronous with the voltage applied to the piezoelectric element 51 is detected from the terminal 1. By way of example, in case of vibrating the semiconductor laser 40 in the clockwise rotational sense, a change in a frequency of the current detected from the terminal 1 becomes large when the semiconductor laser 40 is undergoing the clockwise rotation, whereas a change in a frequency of the current detected from the terminal 1 becomes small when the semiconductor laser 40 is undergoing the counterclockwise rotation. Moreover, when the frequency of the applied voltage is modulated with a frequency which lies outside the band of signal frequencies, the sense of the rotation can be sensed without adversely influencing the beat signal. Of course, the piezoelectric element 51 may well be replaced with any other means capable of imparting desired vibrations.

As described above, in accordance with a gyro according to the present invention, in a ring resonator type laser in which laser beams propagate round, a change in a current or an impedance based on a beat which is generated by the interference of the laser beams traveling in senses reverse to each other within the laser is detected, whereby a beat signal corresponding to the rotation of the laser can be derived. It is accordingly possible to provide a gyro which can omit a photodetector and an optical system for optical coupling as have been indispensable to a prior-art gyro. Further, the beat signal is grasped as a change in the impedance, whereby the influence of the noise of a driving power source for the gyro can be reduced to fabricate a gyro of higher sensitivity. Moreover, a constant-voltage source (battery) is employed as the driving source, whereby the gyro can be made small in size and light in weight.

What is claimed is:

1. A gyro, comprising:

a ring resonator type laser in which laser beams circularly counter-propagate each other;

a driving source driving said laser with a constant-voltage source, wherein said driving source has been modulated with a frequency which lies outside a frequency band of a beat signal; and beat signal detecting means for detecting the beat signal as a change in a current that flows through said ring resonator type laser.

2. A gyro as defined in claim 1, wherein said ring resonator type laser is a semiconductor laser.

3. A gyro as defined in either of claims 1 and 2, wherein said constant-voltage source is a battery.

4. A gyro as defined in either of claims 1 and 2, wherein the current change is a change in a frequency of the current.

5. A gyro as defined in either of claims 1 and 2, wherein the current change is detected as a change in a voltage across a resistor which is connected in series with said ring resonator type laser.

6. A gyro according to claim 1, wherein said driving source includes application of a voltage for the modulation to said constant voltage source.

7. A gyro, comprising:

a ring resonator type semiconductor laser in which laser beams circularly counter-propagate each other;

a driving source driving said ring resonator type semiconductor laser, wherein said driving source has been modulated with a frequency which lies outside a frequency band of a beat signal; and beat signal detecting means for detecting the beat signal as a change in impedance of said semiconductor laser.

8. A gyro as defined in claim 7, wherein said ring resonator type semiconductor laser employs a constant-voltage source as its drive source.

9. A gyro as defined in claim 7, wherein said ring resonator type semiconductor laser includes a battery as its driving power source.

10. A gyro as defined in claim 7, wherein said change in impedance is a change of frequency in impedance.

* * * * *

UNITED STATES PATENT AND TRADEMARK OFFICE
CERTIFICATE OF CORRECTION

PATENT NO. : 6,445,454 B1
DATED : September 3, 2002
INVENTOR(S) : Takahiro Numai It is certified that error appears in the above-identified patent and that said Letters Patent is hereby corrected as shown below:

Title page,
Item [56], References Cited, FOREIGN PATENT DOCUMENTS, "638529" should read -- 6-38529 --.

Column 1,
Line 20, "begun to be developed earliest," should read -- developed first, --.

Column 4,
Line 57, "is" should read -- be --.

Column 7,
Line 19, "of" should read -- by --.
Line 51, "it is also allowed to use" should be deleted.
Line 52, "resin." should read -- resin can also be used. --.

Column 8,
Line 3, "as" should read -- that --.
Line 24, "that" should read -- what --.
Line 29, "is" should read -- be --.

Column 9,
Line 5, "the" (second occurrence) should be deleted.

Signed and Sealed this

Twenty-fourth Day of June, 2003

JAMES E. ROGAN
*Director of the United States Patent and Trademark Office*